(12) United States Patent
Liberty

(10) Patent No.: US 11,249,117 B2
(45) Date of Patent: Feb. 15, 2022

(54) AUTORANGING AMMETER WITH FAST DYNAMIC RESPONSE

(71) Applicant: Matthew Girard Liberty, Olney, MD (US)

(72) Inventor: Matthew Girard Liberty, Olney, MD (US)

(73) Assignee: JETPERCH LLC, Olney, MD (US)

( * ) Notice: Subject to any disclaimer, the term of this patent is extended or adjusted under 35 U.S.C. 154(b) by 279 days.

(21) Appl. No.: 16/530,418

(22) Filed: Aug. 2, 2019

(65) Prior Publication Data

US 2020/0041546 A1 Feb. 6, 2020

Related U.S. Application Data

(60) Provisional application No. 62/713,749, filed on Aug. 2, 2018.

(51) Int. Cl.
*G01R 19/00* (2006.01)
*G01R 19/257* (2006.01)

(52) U.S. Cl.
CPC ..... *G01R 19/0023* (2013.01); *G01R 19/0038* (2013.01); *G01R 19/257* (2013.01)

(58) Field of Classification Search
CPC . G01R 19/003; G01R 19/0038; G01R 19/257
See application file for complete search history.

(56) References Cited

U.S. PATENT DOCUMENTS

| | | | |
|---|---|---|---|
| 1,915,232 A | 6/1933 | Martin et al. | |
| 2,854,661 A | 9/1958 | Emmett et al. | |
| 3,237,102 A | 2/1966 | Newell et al. | |
| 3,875,507 A | 4/1975 | Borax et al. | |
| 4,096,434 A | 6/1978 | Meyer | |
| 4,271,392 A | 6/1981 | Outram et al. | |
| 4,625,173 A | 11/1986 | Wisler et al. | |
| 4,914,383 A | 4/1990 | Wilkerson | |
| 5,144,154 A | 9/1992 | Banaska | |
| 5,610,709 A | 3/1997 | Arrington et al. | |
| 5,920,189 A | 7/1999 | Fisher et al. | |
| 6,356,853 B1 | 3/2002 | Sullivan | |
| 6,380,726 B1* | 4/2002 | Szabo | G01R 15/09 324/115 |
| 6,940,265 B2 | 9/2005 | Hauenstein et al. | |
| 7,466,149 B1 | 12/2008 | Yang | |
| 7,538,539 B1 | 5/2009 | Balke | |
| 8,415,942 B2 | 4/2013 | Fletcher | |
| 9,899,834 B1* | 2/2018 | Mayo | G11C 5/143 |
| 2008/0068029 A1 | 3/2008 | Tanida et al. | |
| 2011/0238347 A1 | 9/2011 | Gemperli et al. | |

* cited by examiner

*Primary Examiner* — Daniel C Puentes
(74) *Attorney, Agent, or Firm* — Dunlap Bennett & Ludwig, PLLC; Brendan E. Squire

(57) ABSTRACT

An autoranging ammeter with fast dynamic response allows improved dynamic measurement of rapidly changing direct electrical currents. The ammeter utilizes a low-cost dual threshold comparator mechanism coupled with an analog-to-digital converter and digital processing to rapidly select the appropriate current shunt resistor.

13 Claims, 4 Drawing Sheets

AUTORANGING AMMETER WITH FAST DYNAMIC RESPONSE

CROSS-REFERENCE TO RELATED APPLICATION

This application claims the benefit of priority of U.S. provisional application No. 62/713,749, filed Aug. 2, 2018, the contents of which are herein incorporated by reference.

FIELD OF THE INVENTION

The present invention relates to test and measurement equipment for electronic devices. The invention is equipment intended for use by hardware engineers, software engineers and electronics enthusiasts to more accurately measure electrical current. The invention allows improved measurement of electrical current, especially for rapidly changing direct currents. The autoranging ammeter 302 includes a voltmeter which enables the device to output current, voltage, power and energy consumed by a target device under test.

BACKGROUND

The number of electronic devices that we purchase, use and control has grown significantly over the past decade. The power for these devices comes from electricity, which is characterized by its voltage (potential) and current (number of flowing electrons). The electric power being consumed is the mathematical product of voltage and current. The total electric energy consumed is the mathematical integral of the power over time.

Measuring and accurately characterizing the power being consumed by these devices is becoming more critical. The battery life for battery-powered devices is strictly limited by the battery and the amount of power consumed over time. Many of these devices are optimized to remain dormant or sleeping a majority of the time, and they consume very little current. When the devices come awake to manage sensors, interact with the world around them and communicate with other devices, they may consume current many orders of magnitude larger than the sleep current. Some devices may rapidly toggle from a sleep state to a wake state and back again in microseconds. The present invention is a novel device for measuring the energy consumed by these devices with wide dynamic range and rapid current changes.

Devices that measure electrical current are commonly called ammeters, and they have been in production for well over a century. The first ammeters in the 1800s were called "rehoscopes". Ammeters are typically optimized to measure either direct current or alternating current. Direct current is a current of a single positive or negative polarity. Alternating current switches from positive polarity to negative polarity, often at a fixed, specific frequency. Ammeters typically have fixed ranges of current measurement. On the high current side, they are limited by their design, ability to handle the current, and the amount of voltage drop that they impart on the system. On the low current side, they are limited by the noise floor and their analog sensing chain.

Ammeters with a single fixed range have limited utility. Many ammeters and other equipment including ammeters, such as multimeters, have a multitude of selectable ranges. Some ammeters have manually selectable ranges, and the operator configures the instrument for the desired range. Ammeters that can switch their current measurement ranges automatically based upon the actual current are called autoranging ammeters.

The goal of most test equipment is to impart minimal change of the system they are measuring. Ammeters are inserted in the line of electrical current. Inevitably, the ammeters have some impedance that imparts a voltage drop over the ammeter. According to Ohm's law, voltage=current*resistance. Existing equipment often imparts a voltage drop that is significant for modern digital components, which use 3.3V, 2.7V, 2.5V, 1.8V, 1.2V and even 0.9V supplies. Minimizing this ammeter voltage drop "glitch" during current measurements is critical for modern electrical devices. Autoranging ammeters usually have a momentary "glitch" when switching ranges. The duration and magnitude of the "glitch" varies by measurement technology and implementation, but this "glitch" causes measurement inaccuracies.

As can be seen, there is a need for an improved autoranging ammeter that rapidly detects when a range change is required and then switches quickly to minimize this voltage drop for improved accuracy and precision.

SUMMARY OF THE INVENTION

The present invention is an autoranging ammeter that can accurately measure current, even when the current quickly changes by many orders of magnitude. The ammeter contains multiple current sense resistors that measure different current ranges. The ammeter dynamically selects the appropriate current sense resistor based upon the actual current. The ammeter selects lower value current sense resistors for higher current and higher value current sensors for lower current. Selecting the appropriate range for constant currents is trivial and is implemented by common multimeters. Selecting the appropriate range for rapidly changing currents is much more difficult. The present invention uses a novel dual comparator solution that approximates the mathematical derivative of the current increases. If both comparators become active within a fixed time interval, the present invention jumps current ranges to ensure accurate measurement while maintaining a low voltage drop across the ammeter. If only the lower threshold comparator becomes active in the fixed time interval, then the present invention switches by a single current sense resistor range. When current decreases, the ammeter dynamically selects between higher value current sensor resistors by comparing the ammeter digital value output over time.

The autoranging ammeter also includes a voltmeter and additional processing. The processing applies calibration coefficients, computes power and computes energy. The autoranging ammeter includes software running on a general-purpose computing platform that can display current, voltage, power and energy over time.

The autoranging ammeter achieves significant performance at a reduced cost compared to contemporary ammeters. The autoranging ammeter is designed to measure currents ranging from 10 nA up to 2 A with limited duration current bursts up to 9 A. The autoranging ammeter is designed to measure supply voltages from 0 V to 13.2 V. The autoranging ammeter 302 has a sampling frequency of 2 million samples per second and a bandwidth greater than 250 kHz.

These and other features, aspects and advantages of the present invention will become better understood with reference to the following drawings, description and claims.

DETAILED DESCRIPTION AND BEST MODE OF IMPLEMENTATION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Broadly, embodiments of the present invention provide a system, method, and apparatus for to measure the voltage, current, power and energy consumed by a target device under test (DUT).

Figure 1:
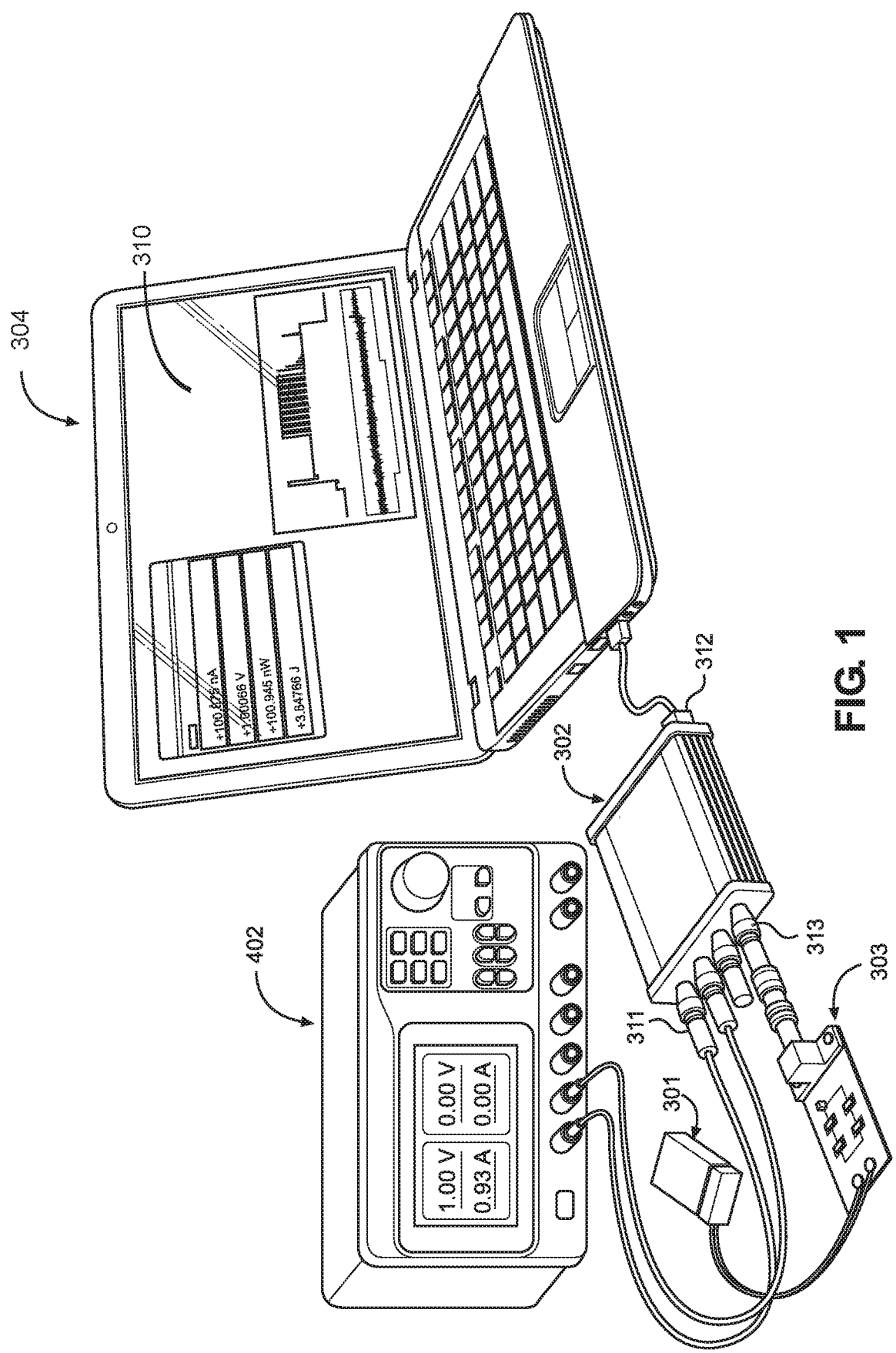
FIG. 1 is a view of a representative setup of an autoranging ammeter in use to perform measurements.
Figure 4:
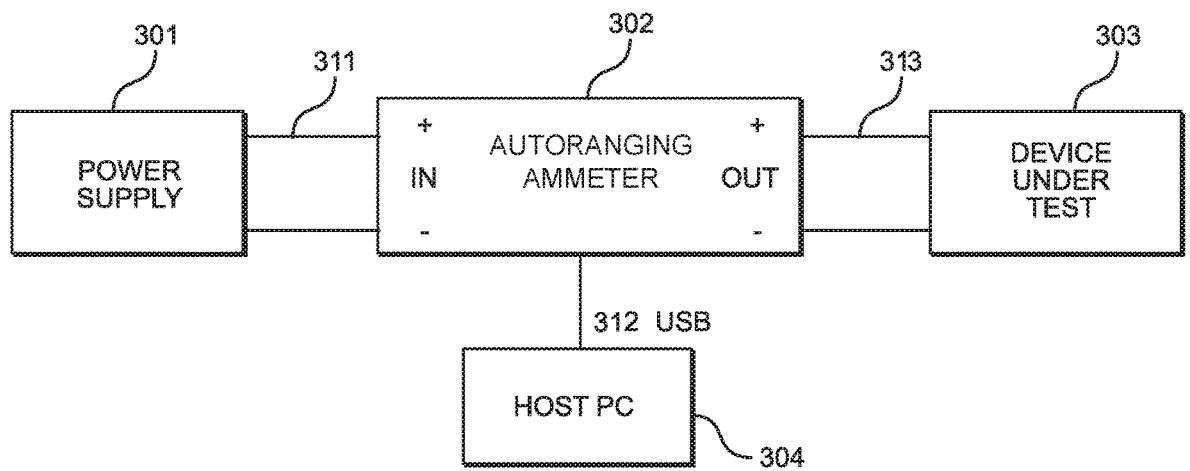
FIG. 4 is a schematic diagram of a typical system setup using the present invention to measure the voltage, current, power and energy of a target device under test.

As shown in FIGS. 1 and 4, a representative system employing the present invention includes: an autoranging ammeter 302, a power supply 402, a device under test 303 and a host computing device, such as a personal computer (PC) 304. The power supply 402 can be any type of power supply to provide a power source for the DUT 303, including a DC bench power supply, an AC-DC power adapter and a battery.

The device under test 303 can be any device of interest, including a microcontroller, an assembled printed circuit board, an electronic subassembly and a simple resistor. FIG. 1 shows a device under test 303 with an auxiliary 9V battery supply 301. The host PC 304 can be any computing device that is in communication with an output of the autoranging ammeter 302, such as a host USB connection. The host PC 304 may operate under any suitable operating system, including a Microsoft® Windows PC, a Linux PC, an Apple® Macintosh and a Raspberry Pi running Linux. One skilled in the art will recognize that the examples given for 301, 303 and 304 are demonstrative only and that other combinations are possible without affecting the scope of the present invention.

Multiple connection types are possible between the power supply 402, the autoranging ammeter 302 and the target DUT 303. By way of non-limiting example, the connection 311 may include a banana jacks which allow for a low voltage drop across the connections. The powersource connections 311 and the DUT connections 313 use a conductor of a suitable wire gauge with banana plugs. The autoranging ammeter 302 includes configurable options to support other connector types. Common alternative connector types include BNC connectors with RG48/U coax cable, SMA connectors with RG316 coax cable, rectangular connectors with ribbon cable, rectangular cables with wire, terminal blocks with wire, and the like.

In the non-limiting embodiments shown, the autoranging ammeter 302 communicates with the Host PC 304 over a USB link connection 312. The autoranging ammeter 302 the USB link connection 312 may use a USB 2.0 Bulk or a USB 2.0 isochronous mode to convey the outputs from the autoranging ammeter 302 to an input of the host PC 304. One skilled in the art will recognize that other communication mechanisms are possible, including but not limited to USB 3.0, Ethernet and Wi-Fi. The autoranging ammeter 302 uses off-the-shelf USB drivers including libusb and WinUSB to interface with the autoranging ammeter 302.

The Host PC 304 runs software written in any suitable programming language, such as Python, that is configured to communicate with the autoranging ammeter 302 and processes the data received. The software may include a graphical user interface (GUI) 310 to display the outputs of the DUT 303, measured by the autoranging ammeter 302 and allow the operator to explore the data. Exploration options may include a record, a save, a load, a zoom and a pan of the measured data. The GUI 310 may display current with linear axes or logarithmic axes. Due to the wide dynamic range of many target DUTs 303, logarithmic axes are often more useful to the operator. The GUI 310 may display numerous user selectable quantities individually or simultaneously, including current, voltage, power, energy, program counter, and logging output from the target DUT 303.

Figure 5:
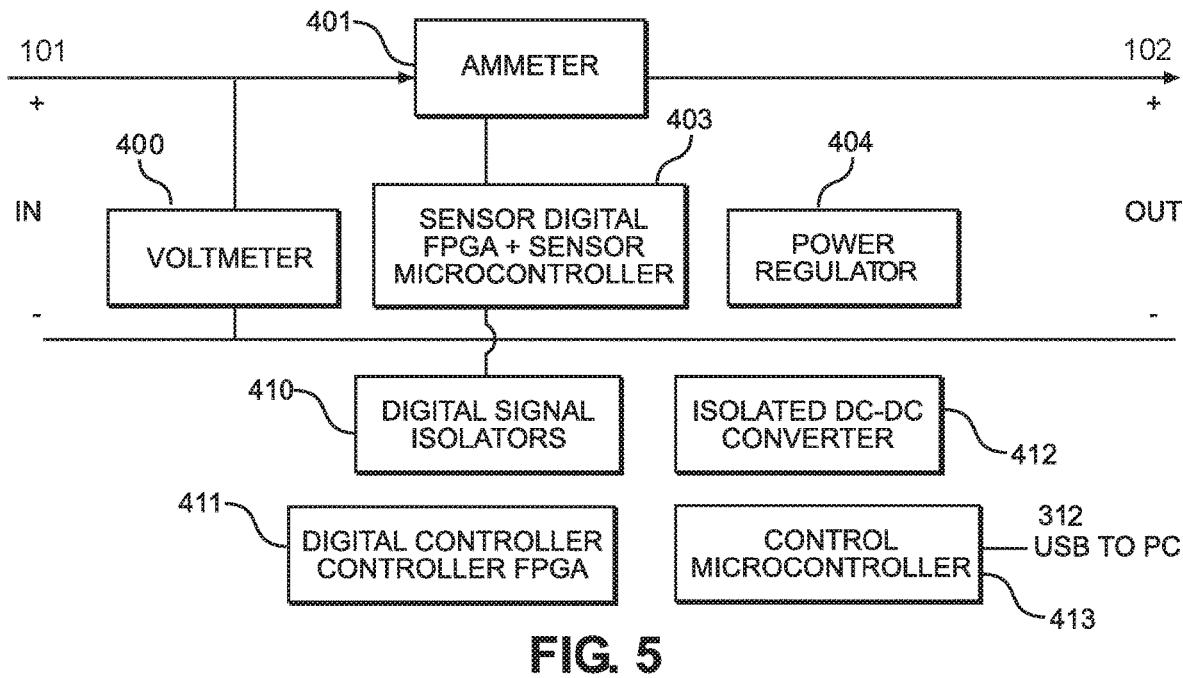
FIG. 5 shows a block diagram of the autoranging ammeter.
Figure 6:
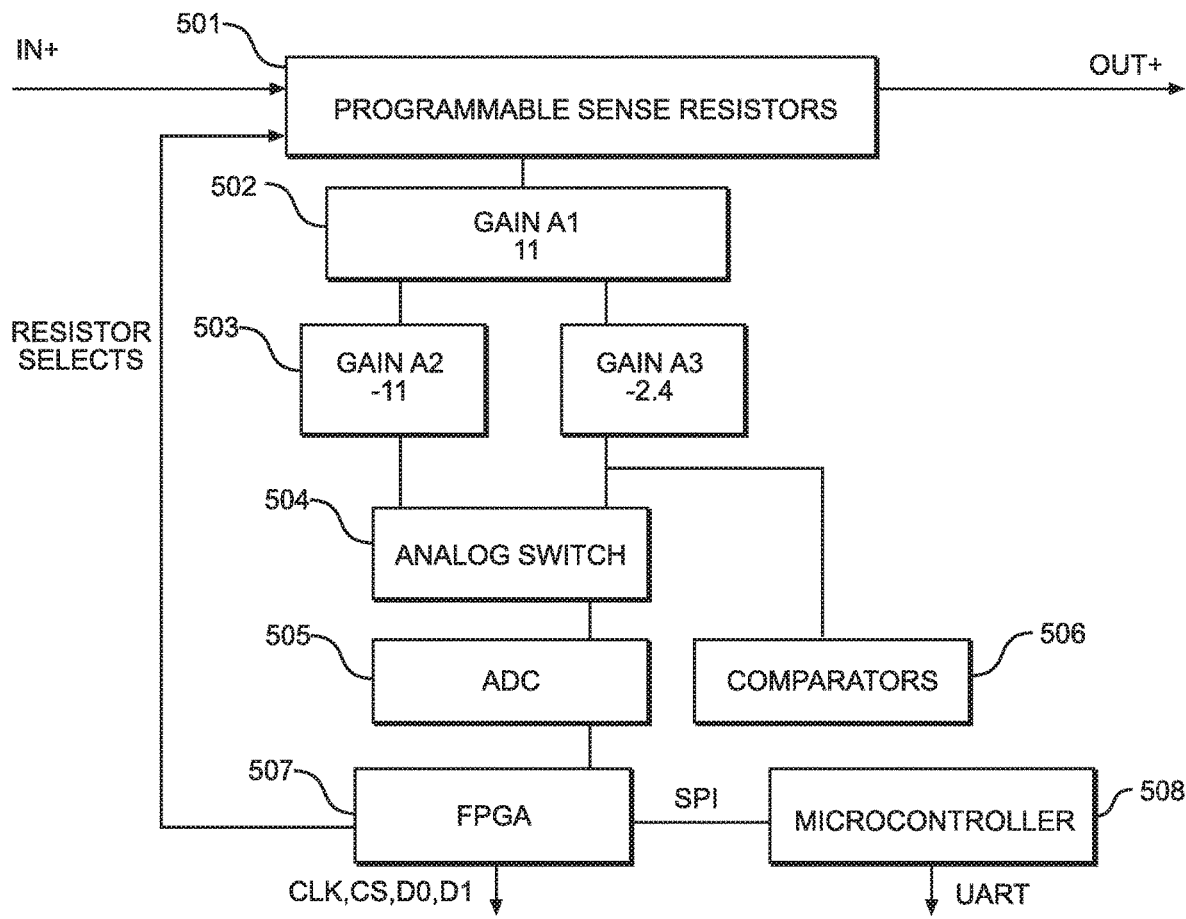
FIG. 6 shows a detailed block diagram of the autoranging ammeter.

As seen in reference to FIG. 5 a block diagram of the autoranging ammeter 302 is shown. The autoranging ammeter 302 includes of an ammeter 401 connected between an input 101 and an output 102 of the autoranging ammeter 302. FIG. 6 shows further details of the ammeter 401. A voltmeter 400 measures the voltage at the input 101 to the autoranging ammeter 302. The voltmeter 400 may be configured using a high-impedance opamp buffer, such as a MAX44250 opamp buffer, manufactured by Maximum Integrate. An opamp divider, such as a MAX44252 with the ADS7056 ADC.

A digital field programmable gate array (FPGA) and digital sensor microcontroller 403 processes the outputs of the ammeter 401 and voltmeter 400. The FPGA also examines the output 102 to select the MOSFETs, which enable active current sense resistor(s). The autoranging ammeter 302 may utilize an ICE5LP2K-SG48ITR50, manufactured by Lattice Semiconductor, for the sensor FPGA and an STM32F091, manufactured by STMicroelectronics as the digital sensor microcontroller.

The digital sensor microcontroller communicates with the FPGA over a serial peripheral interface (SPI) bus. A power regulator 404 provides suitable operating voltages for the ammeter 401, the voltmeter 400 and the FPGA and digital sensor microcontroller 403. A digital signal isolators 410 and an isolated DC-DC converter 412 allow the sensor's electrical ground to be completely independent of the host PC 304. The autoranging ammeter 302 may utilize a Silicon Labs Si8661 for the digital isolator 410 and a CUI Inc. Series PDS1-S5-S9-M for the isolated DC-DC converter 412. A digital controller FPGA 411 receives the data from the sensor FPGA 403 and relays the data to a control microcontroller 413.

The autoranging ammeter 302 may utilize the Lattice ICE5LP2K-SG48ITR50 for the controller FPGA 411 and an NXP Semiconductor LPC54608J512 as the control microcontroller 413. The control microcontroller 413 communicates with the host PC 304 over high-speed USB 2.0 and with the sensor microcontroller 403 over UART.

One skilled in the art will recognize that careful design is required for the isolated DC-DC converter 412 and the power regulator 404. The autoranging ammeter 302 limits the voltage across the shunt resistors to 20 mV maximum. On a 14-bit ADC used by the autoranging ammeter 302, this means that the least significant bit (LSB) represents about 1 μV. Even though the opamps do offer power supply rejection, power supply noise can easily couple into the signal path through a variety of methods. Implementing the present invention requires careful attention to analog design of both the analog signal path and the power regulation.

Figure 2:
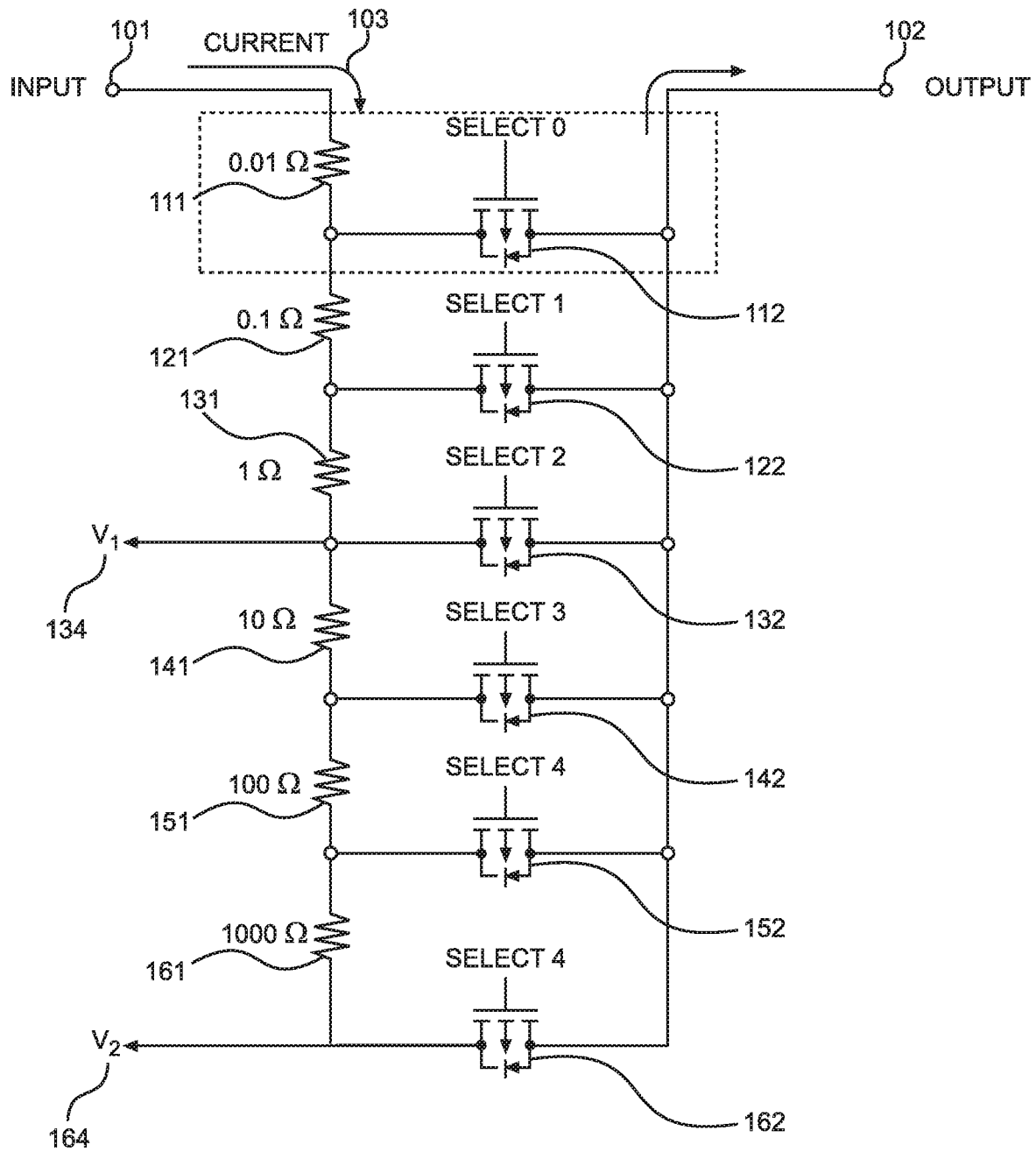
FIG. 2 is a schematic diagram which shows the current sense resistors and selection MOSFETs in the autoranging ammeter.
Figure 3:
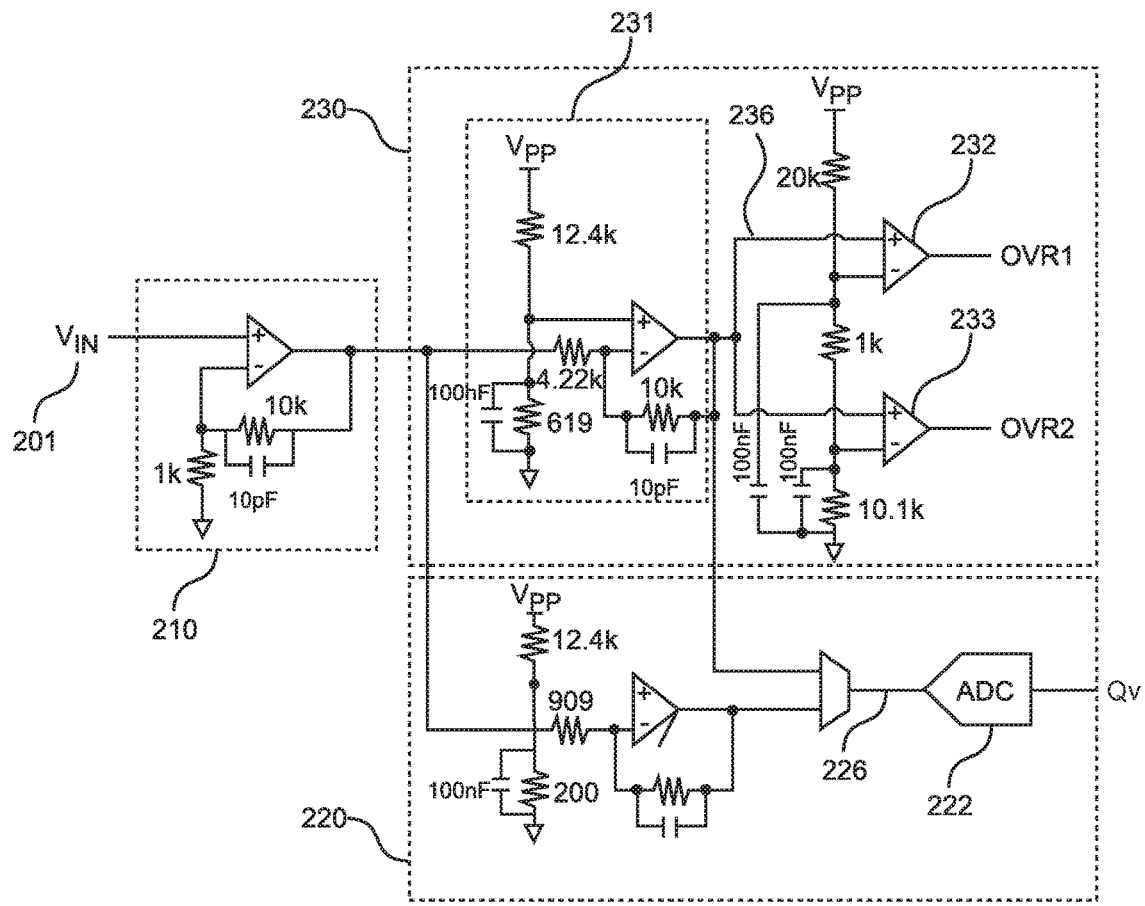
FIG. 3 is a schematic diagram shows the analog gain stage and comparator that amplifies the voltage from the current sense resistors.

As seen in reference to FIG. 2, the autoranging ammeter 302 accurately measures the current 103 flowing from an INPUT 101 to the OUTPUT 102 of the autoranging ammeter 302. The present invention computes the current by passing the current through a plurality of resistors 111, 121, 131, 141, 151 and 161 in a series connection, with each of the plurality of resistors 111, 121, 131, 141, 151 and 161 having a known value, and then computing the voltage across the plurality of resistors. Common terms for these resistors are "shunt resistors" and "current sense resistors". The present invention uses two or more shunt resistors 111, 121, 131, 141, 151 and 161 of different values which may be connected or disconnected from the circuit.

In the non-limiting embodiment shown, the autoranging ammeter 302 uses six different resistors 111, 121, 131, 141, 151 and 161 with values of 0.01 Ohms, 0.1, Ohms, 1 Ohm, 10 Ohms, 100 Ohms and 1000 Ohms, respectively. The autoranging ammeter 302 also utilizes a P-channel MOSFETs to connect each shunt resistor to the output 102. The P-channel MOSFETs are 112, 122, 132, 142, 152 and 162. When a MOSFET is enabled, current can flow from the INPUT, through the selected resistor, through the selected MOSFET and then out the OUTPUT. If the first MOSFET is enabled, then current can flow from the INPUT 101, though resistor 111, through MOSFET 112 and out the OUTPUT 102. The voltage across resistor 111 in the autoranging ammeter 302 is then 0.01 Ohms*current. For a 1 Ampere (A) current, the voltage would be 10 millivolts (mV).

The voltage is then measured at anode 134. Although node 134 is not directly connected to resistor 111, node 134 is connected through resistor 121 and resistor 131. With careful design, the amount of current flowing through resistor 121 and resistor 131 can be very small, so that the voltage at node 134 relative to INPUT 101 is approximately equal to the voltage across resistor 111. Note that the voltage across 111 will be negative with respect to 101 given the direction of current 103.

The autoranging ammeter 302 allows for different resistance values to enable different current ranges. If MOSFET 112 is disabled and MOSFET 122 is enabled, then current must flow through both resistor 111 and resistor 121. The total resistance is then 0.01 Ohms+0.1 Ohms which totals 0.11 Ohms. In this configuration, the voltage at node 134 is 11 times more sensitive to when only MOSFET 112 is enabled. This process can be repeated for each shunt resistor. When only MOSFET 162 is enabled, the total resistance is 1111.11 Ohms. In this configuration, the voltage at node 164 is 111111 times more sensitive to when only MOSFET 112 is enabled. The resistance values shown in FIG. 2 are those used in the autoranging ammeter 302. However, one skilled in the art will recognize that other values may be selected to achieve the same result. One skilled in the art will also recognize that the MOSFETs may be selected for the current rating of its paired sense resistor range. The P-channel MOSFETs are enabled when the gate voltage is sufficiently less than the source voltage.

The digital logic 403 outputs signals at +3.3V which cannot directly drive the P-channel MOSFETs. The autoranging ammeter 302 may utilizes a fast MCP6562 comparators manufactured by Microchip Technology Inc, referenced to a −5V supply to drive the MOSFET gates. The digital logic signals are divided by 2 between their output and the −5V supply using two 4.7 kOhm resistors. The MCP6462 then compares the divided output to the −1.69V reference. The result of the MCP6562 comparison then drives the MOSFET gate.

The autoranging ammeter 302 may use two difference voltage sense nodes, node 134 and node 164. The design would work correctly with static (constant) currents with only a single sense node 164. However, node 164 has a high impedance relative to resistor 111. When MOSFET 112 is enabled, the impedance difference between the INPUT 101 to OUTPUT 102 is much lower than the impedance difference between resistor 111 and the measurement node 164. This high impedance difference is susceptible to both capacitive coupling and inductive coupling.

In practice, this coupling effect makes having a single measurement node prohibitive for measurement systems with dynamic currents that vary at higher frequencies. The autoranging ammeter 302 splits the measurement sense into two nodes. Measurement node 134 is used when MOSFET 112, MOSFET 122 or MOSFET 132 is enabled. Measurement node 164 is used when MOSFET 142, MOSFET 152 or MOSFET 162 is enabled. Splitting the voltage sense node significantly reduces the coupling effect for higher precision dynamic measurements.

The measurement voltage output connects to the voltage sense circuitry shown in FIG. 2. This section describes the voltage sense circuitry for a single measurement node. Either measurement node 134 or 164 connects to $V_{IN}$ 201. The operation amplifier (opamp) gain circuit 210 increases the voltage measured over the shunt resistor(s) by 11. Note that the ground is selected to be the INPUT 101, and the expected $V_{IN}$ 201 is a negative voltage. The opamp selection is critical to proper operation. The opamp must have very low leakage current into its + input, very low offset voltage and sufficient gain-bandwidth product for the signals of interest. The input leakage current, also called input bias current, is critical since it can allow the current to bypass the OUTPUT 102. The autoranging ammeter 302 may use the MAX4239 opamp.

A second opamp stage 220 inverts the voltage so that it becomes positive, applies an additional gain of 11, and applies a voltage offset so that the zero current is within the dynamic response range of the analog-to-digital converter (ADC). The selection of this opamp is less critical than 210 since the signal is larger and input bias currents are not a significant concern. The present embodiment uses the MAX44252.

The present invention attempts to keep a burden voltage to a minimum. The burden voltage is the total voltage difference from INPUT 101 to OUTPUT 102. A critical aspect is rapidly decreasing the total selected resistance when the current rapidly increases. The overflow detector 230 enables rapid current increase detection.

The overflow detector 230 includes an opamp stage 231 which inverts the measured voltage so that it is positive. The opamp output is then fed to two comparators that form a basic derivative detector. A first comparator 232 detects when the sense resistor voltage exceeds the maximum target, which is 20.93 mV for the autoranging ammeter 302. A second comparator 233 detects when the sense resistor voltage exceeds a second target, which is 25.00 mV for the autoranging ammeter 302. These two values along with time are used to determine changes to the selected resistors as described below.

The autoranging ammeter 302 shares the second opamp stage 220 and the overflow detector 230 to reduce overall product cost. Instead of fully duplicating the voltage sense circuitry for voltage measurement node 134 and voltage measurement node 164, the autoranging ammeter 302 uses analog switches at 226 and 236 to reuse comparator 232, comparator 233 and ADC 222. The autoranging ammeter 302 may use an NXP Semiconductor NX3L4357GM for the analog switches 226, 236 and a Texas Instruments ADS7056 for the ADC 222. The analog switch 226, 236 could be inserted further to the left to increase component reused between channels. However, the voltage input $V_{IN}$ is negative at 201 and after 210 which restricts the availability of suitable analog switches. The present embodiment selects 226 and 236 as a reasonable design tradeoff, but one skilled in the art the voltage sense paths could be merged at other points or not merged at all without affecting the present invention.

The autoranging ammeter 302 uses the analog to digital converter output, the active shunt resistor, and calibration coefficients to compute the current. The autoranging ammeter 302 is designed to be linear, so the trivial linear transformation is:

current=(ADC_output−offset)*scale

Due to the architecture of the present embodiment, the offset is typically the same for the same analog paths. The scale varies based upon the active shunt resistor. One skilled in the art will recognize that these calibration coefficients can be computed once based upon the design, computed for each device during manufacturing, and/or computed after manufacturing. The autoranging ammeter 302 uses calibration coefficients computed for each device at manufacturing to eliminate the effect of manufacturing variations. The autoranging ammeter 302 also allows for a recalibration service after manufacturing.

The calibration process described above is for a simple linear equation, which is suitable for the accuracy of the autoranging ammeter 302. One skilled in the art will recognize that the calibration process can compensate for additional factors. Additional factors may include temperature, nonlinearity, power supply voltage, humidity, atmospheric pressure, mechanical stress and component aging.

One skilled in the art will recognize that applying calibration to compute current may be performed in one or more places without altering the present invention. The current may be computed in the sensor FPGA, the sensor microcontroller, the controller FPGA, the controller microcontroller and/or the Host PC. The computation of voltage, power and energy may likewise be performed in any or all of these locations. Some features, such as a soft-fuse, may require current to be calculated in the sensor FPGA to enable a sufficiently fast response. Since the measured current and select is only 15 bits in width and the calculated current is common 32 bits, the raw values may be presented all the way to the host PC to reduce communication bandwidth.

FIG. 5 shows a detailed view of the ammeter 401 in the autoranging ammeter 302. The programmable sensor resistors 501 are shown in FIG. 2 in more detail. An initial gain stage 502, a secondary gain stage 503, analog switches 504, an ADC 505 and comparators 506 are shown in FIG. 2 in more detail. The output of the ADC 505 connects to the sensor FPGA 507. The output of the comparators 506 also connects to the sensor FPGA 507. The sensor FPGA 507 runs a current sense resistor selection algorithm that dynamically selects the appropriate resistor to match the current.

The current sense resistor selection algorithm has four inputs: comparator threshold 1 (OVR1), comparator threshold 2 (OVR2), the ammeter ADC value (Qv) and time. In the present embodiment, the comparator threshold detections are binary output signals, the ammeter ADC output is a 14-bit digital value, and time is represented in digital FPGA clocks at 48 MHz The present invention uses these values and the algorithm to limit the voltage drop across the sense resistors under dynamic conditions. The present embodiment limits the voltage drop to 20 mV while also maintaining sufficient resolution for accurate measurement. For underflow (moving to larger value resistors and higher select values), this algorithm relies upon the primary 14-bit ADC values which measure the voltage across the selected sense resistors. However, these values are delayed by two op-amp filter delay times and the ADC's 2 sample time latency. For faster overflow detection, the algorithm relies upon two dedicated threshold comparators. The lower threshold comparator determines that a resistance decrease is imminent. If the upper threshold is hit within a preset time, then the current demand of the target device under test is increasing rapidly. The algorithm uses this indication to perform a rapid jump shift in resistance decrease.

One skilled in the art will recognize that the same current derivative may be computed based upon the ADC outputs. The drawback is increased latency between the increased current event and the detection of said event. In the autoranging ammeter 302, each opamp imparts a delay, and the ADC imparts an additional 2 sample delay. Digital processing results in further delay. At 2 MSPS, using the ADC outputs, the total delay could easily exceed 2 μs. In contrast, the autoranging ammeter 302 can fully respond to over-current conditions in under 1 μs.

The autoranging ammeter 302 has a 14-bit ADC which gives LSB=3.3V/2**14=0.2014 mV. Accounting for the analog gain stages, the input maps to 1.538 μV/LSB=650.1 LSBS/mV. The autoranging ammeter 302 allows for configurable underflow threshold T_POS_UND, but the default is 961 LSBs greater than the zero current offset value, Qk, which is 1/12.5 of the target positive range of a single sense resistor. The present embodiment uses sense resistors spaced by factors of 10, so a factor of 1/12.5 allows hysteresis overlap. This overlap allows a switch in range to not immediately switch back to the prior range.

The threshold algorithm in the autoranging ammeter 302 is given by the following pseudo-code:

```
if OVR lockout end
    if OVR2:
        select <= saturate(select − 3), reset_counters
        OVR lockout start
    elif OVR1:
        select <= saturate(select − 1), reset_counters
        OVR lockout start
    elif OVR1 & no OVR lockout:
        OVR lockout start
    elif sample available:
        if Qv < T_NEG_OVR:
            if neg_lockout == 0
                select <= saturate(select − 1)
                neg_lockout = 3
            else:
                neg_lockout += 1
        elif (T_NEG_UND + Qk) < Qv < (T_POS_UND + Qk):
            if range_underflow_count[select + 4]:
                select <= saturate(select + 1), reset_counters
                range_underflow_count = 0
```

-continued

```
        else:
                range_underflow_count += 1
        else:
                range_underflow_count = 0
```

The OVR lockout is the delay between the detection of OVR1 and when a decision is made. This time duration determines the minimum current derivative slope required to trigger a jump shift in current range. In the autoranging ammeter 302, OVR1 corresponds to approximately 21 mV across the shunt resistors, and OVR2 corresponds to approximately 25 mV across the shunt resistors. The OVR lockout is 12 clocks at 48 MHz, or 250 ns. Therefore, any current change that causes the shunt resistor voltage to increase faster than 4 mV/250 ns (16 mV/µs) will cause a jump shift in current range.

T_NEG_OVR is the negative "overflow" value, and the present invention uses a value of 255 for a 14-bit ADC. While the present embodiment is meant to be a unipolar device, this value allows increasing the range (lowering the shunt resistor value) for large negative currents. This additional detection maintains a low voltage drop across the device even if the operator connects the device in the reverse polarity. The autoranging ammeter 302 has significantly degraded dynamic performance while connected in the negative polarity configuration.

The "saturate" operator is used to keep the selected shunt resistor within the allowed range. The autoranging ammeter 302 has 6 shunt resistors plus one lower-gain op-amp option for very high currents. The select value must therefore be constrained to be within 0 and 6, inclusive. The "saturate" operator returns the following:

0 if value<=0
6 if value>=6
value otherwise

The range_underflow_count is a counter that enables switching to more sensitive ranges with high current shunt resistor values. Higher shunt resistors present a higher impedance between the source and the target device under test. In many systems, the source and DUT have capacitance. The shunt resistance of the present invention with capacitors on either side forms an analog filter. As the shunt resistance increases, the time constant of the filter also increases. The algorithm used by the present embodiment increases the time required to switch to higher resistances in rough proportion to the resistance. The present embodiment uses a binary bit selection based upon the present select value plus 4, which yields sufficient performance in many real-world cases. A foreseen improvement could use specific time thresholds for the transition to each sense resistor. Another foreseen improvement could dynamically estimate the source and DUT capacitances based upon previous shunt resistor range switching settling times and dynamically adapt the time thresholds, specifically for the source and DUT. This later improvement could minimize the switching delay on underflow to maximum measurement resolution.

One skilled in the art will recognize that the MOSFET selection should be make-before-break to present a consistent path for electrical current to the DUT. The MOSFETs of the higher-value shunt resistors may remain selected or may be disabled without significantly affecting the gross operation of the present invention. Each MOSFET has a gate-source leakage current and drain-source leakage current that must be considered for the optimal operation. The present embodiment uses make-before-break and does turn off all MOSFETs except for the selected current shunt resistor to minimize gate-source leakage.

The autoranging ammeter 302 communicates between the FPGAs using four signals: a 48 MHz clock, a chip select and two data bits: one for current and one for voltage. The current ADC and voltage ADC are sample simultaneously, and their values are sent in parallel on the data bits. The 14-bit samples are extended with two bits that encode the shunt resistor select at the time of the sample. At 2 Msps, a total of 32 Mbps×2 are required, and this interface offers 48 Mbps×2.

In the autoranging ammeter 302, the Control FPGA 411 receives the samples from the Sense FPGA 507. The Control FPGA 411 notifies the Control Microcontroller 413 when new data is available. The Control Microcontroller 413 reads the sample data from the Control FPGA 411 over an 8-bit memory bus, packages the sample data into USB frames, and sends the sample data to the Host PC 304. One skilled in the art will recognize that other communication protocols may be used without affecting the present invention.

The autoranging ammeter 302 uses P-channel MOSFETs and shunt resistors in a "low-side" current sensing configuration. The system zero voltage reference, often called electrical "ground", is relative to IN+. This configuration enables the autoranging ammeter 302 to turn off all MOSFETs under software control, which in turn disables current to the device under test. The autoranging ammeter 302 uses this feature to implement a software-controlled fuse (soft-fuse). The soft-fuse uses the current, voltage and time as inputs. The soft-fuse can trip and shut off power to the device under test under a number of different cases. The simplest case is if the current exceeds a preset threshold over a preset time duration. Another is if the energy exceeds a preset threshold over a time duration. One skilled in the art will recognize that multiple thresholds of varying durations and mechanisms can be set simultaneously. With suitable configuration, the soft-fuse can have both high-current fast-trip and longer term slow-trip functionality, simultaneously. In the autoranging ammeter 302, the soft-fuse feature only works when the source and DUT are connected with the correct polarity, due to the parasitic body diodes in the MOSFETs that conduct in the reverse current direction.

The autoranging ammeter 302 also uses a fully isolated power supply for the sensor. This design choice eliminates ground loops and reduces measurement noise in the typical test system. A foreseen variation is to flip the sensor arrangement and use N-channel (rather than P-channel) MOSFETs on the negative line referenced to IN−. The potential drawback of this approach is that it introduces variable impedance and voltage drop across the negative supply to the DUT, which can case additional complications if the DUT 303 is connected to other equipment. Another potential variation is to use N-channel MOSFETs on the positive line referenced to OUT+. The drawbacks of this approach are that the MOSFETs cannot turn off due to the parasitic body diode and the OUT+ reference has variable impedance relative to IN+ due to the shunt resistors. This variation results in increased measurement noise under dynamic conditions.

Another foreseen variation is an embodiment that uses a non-isolated supply. Using the flipped sensor arrangement and N-channel MOSFETs on the negative line referenced to IN− is trivial. The embodiment of P-channel MOSFETs referenced to IN+ is also possible. The first opamp stage 210 would need to take the difference between the input 101 and either node 134 or node 164, both of which could be large positive voltages. Since the autoranging ammeter 302 is referenced to the input 101, one input is ground and another is a small negative voltage. In the foreseen non-isolated P-channel embodiment, the common solution is to use an instrumentation amplifier with suitable common mode rejection.

The remainder of the sensor other than the first opamp stage 210 and the MOSFET gate drivers could then remain the same as the autoranging ammeter 302. The drawbacks are increased offset error and decreased bandwidth. Single chip solutions, such as the Texas Instruments INA219, are designed for this high-side current sensing, but they lack the bandwidth and low-current resolution.

It should be understood, of course, that the foregoing relates to exemplary embodiments of the invention and that modifications may be made without departing from the spirit and scope of the invention as set forth in the following claims.

What is claimed is:

1. An autoranging ammeter for measuring an electrical current comprising:
   a plurality of shunt resistors in a series connection, a first end of the series connection attached to an input of the autoranging ammeter;
   a corresponding metal-oxide-semiconductor field-effect transistor (MOSFET) electrically connected between each of the plurality of shunt resistors in the series connection and an output of the autoranging ammeter, the corresponding MOSFET operable to select a shunt resistor value from the plurality of shunt resistors;
   at least one operational amplifier configured to amplify a shunt resistor voltage to an amplified shunt resistor voltage;
   an analog to digital converter connected to an output of the operational amplifier to provide a measured voltage;
   a first comparator that compares the amplified shunt resistor voltage to a first preset threshold voltage T1;
   a second comparator that compares the amplified shunt resistor voltage to a second preset threshold voltage T2; and
   a digital decision logic configured to examine an output of the first comparator and an output of the second comparator, to compute an approximate electrical current time derivative using a time difference between each comparator detecting that the amplified shunt resistor voltage exceeds its corresponding preset threshold voltage, and to enable the corresponding MOSFET to select a lower shunt resistor value from the plurality of shunt resistors.

2. The autoranging ammeter of claim 1, wherein the digital decision logic selectively enable and disable the corresponding MOSFET to select a higher shunt resistor value based on the output of the analog to digital converter.

3. The autoranging ammeter of claim 1, further comprising:
   a plurality of cascaded stages, each stage having a shunt resistor, a MOSFET, an opamp, analog to digital converter, and a first and a second comparator.

4. The autoranging ammeter of claim 1, further comprising:
   a voltmeter to measure a voltage supplied to a target device under test.

5. The autoranging ammeter of claim 3, further comprising:
   a power output computed as current multiplied by voltage.

6. The autoranging ammeter of claim 3, further comprising:
   an energy output computed as the integral of power over time.

7. The autoranging ammeter of claim 1, further comprising
   a microcontroller configured to implement the digital decision logic.

8. The autoranging ammeter of claim 7, wherein an ammeter current is determined in the microcontroller from the measured voltage value.

9. The autoranging ammeter claim 1, further comprising:
   a field-programmable gate array (FPGA) configured execute digital decision logic.

10. The autoranging ammeter of claim 9, wherein an ammeter current is determined in the FPGA from the measured voltage value.

11. The autoranging ammeter of claim 1, further comprising:
    a host computer in communication with an output of the autoranging ammeter and an ammeter current is based on the measured voltage value.

12. The autoranging ammeter of claim 1, further comprising:
    a logic controlled fuse that disables the corresponding MOSFET on an over-threshold condition.

13. The autoranging ammeter of claim 12, wherein the over-threshold condition is one or more of a current threshold, a voltage threshold, a power threshold, an energy threshold and a duration.

* * * * *